(12) United States Patent
Hata et al.

(10) Patent No.: US 7,511,232 B2
(45) Date of Patent: Mar. 31, 2009

(54) SUBSTRATE FOR MOUNTING ELECTRONIC PART AND ELECTRONIC PART

(75) Inventors: Shohei Hata, Yokohama (JP); Naoki Matsushima, Yokohama (JP); Takeru Fujinaga, Hitachinaka (JP)

(73) Assignee: Hitachi Kyowa Engineering Co., Ltd., Ibaraki (JP)

( * ) Notice: Subject to any disclaimer, the term of this patent is extended or adjusted under 35 U.S.C. 154(b) by 139 days.

(21) Appl. No.: 11/378,450

(22) Filed: Mar. 20, 2006

(65) Prior Publication Data

US 2006/0237231 A1  Oct. 26, 2006

(30) Foreign Application Priority Data

Apr. 25, 2005  (JP)  ............................. 2005-126080

(51) Int. Cl.
*H01L 23/495* (2006.01)
(52) U.S. Cl. .................... 174/536; 174/255; 174/257
(58) Field of Classification Search ........... 174/528, 174/536, 551, 255, 257; 257/772
See application file for complete search history.

(56) References Cited

U.S. PATENT DOCUMENTS

| 4,529,667 A | 7/1985 | Shiga et al. |
| 4,707,724 A | 11/1987 | Suzuki et al. |
| 6,518,508 B2 | 2/2003 | Park et al. |
| 6,943,435 B2 * | 9/2005 | Kobayashi .................. 257/673 |
| 2003/0030149 A1 * | 2/2003 | Miura et al. ................. 257/772 |
| 2003/0034381 A1 * | 2/2003 | Nakatsuka et al. ....... 228/180.1 |
| 2003/0143419 A1 * | 7/2003 | Nakamura .................. 428/646 |
| 2003/0186072 A1 * | 10/2003 | Soga et al. .................. 428/620 |

FOREIGN PATENT DOCUMENTS

| JP | 05-190973 | 7/1993 |
| JP | 2001-345336 | 12/2001 |
| JP | 2002-190490 | 7/2002 |
| KR | 2002-0045360 A | 6/2002 |

\* cited by examiner

*Primary Examiner*—Hung V Ngo
(74) *Attorney, Agent, or Firm*—Antonelli, Terry, Stout & Kraus, LLP.

(57) ABSTRACT

The present invention is characterized by a structure having a substrate 1, and metallization layers 2 formed on the substrate 1, on which a Sn solder film 3 and an Ag film 4 are formed. The Ag film 4 is a metal free from oxidization at room temperature in the atmosphere. In a wet process, since only an exposed side of the Sn solder film 3 is oxidized by the cell reaction of Ag and Sn, an upper surface of the Ag film 4 on the solder film, which would otherwise affect the connection, is not oxidized. Since the Ag film 4 melts into the Sn solder simultaneously with melting of the Sn solder film 3, the Ag film 4 does not hinder the connection.

3 Claims, 3 Drawing Sheets

SUBSTRATE FOR MOUNTING ELECTRONIC PART AND ELECTRONIC PART

CLAIM OF PRIORITY

The present application claims priority from Japanese patent application serial no. 2005-126080, filed on Apr. 25, 2005, the content of which is hereby incorporated by reference into this application.

BACKGROUND OF THE INVENTION

The present invention relates to a substrate for mounting an electronic part (e.g. an electronic device), in which a solder film is formed on metallization layers, and an electronic part, in which a solder film is formed on a connection point or a lead surface.

Solder is formed on a substrate, an electrode of an electronic part or a lead of an electronic part, in very many products. Specifically, the following measures are frequently used in mounting of an electronic part: (1) forming metallization layers, which is to serve as an electrode, on a substrate, forming a solder film on the metallization layers, and using the solder film for connection to the electronic part; (2) forming metallization layers on an electrode of an electronic part, forming a solder film on the metallization layers, and using the solder film for connection to another electronic part; and (3) forming a solder film on a lead surface of an electronic part, which includes a lead, and also melting the solder film to carry out connection at the time of connection to a printed circuit board.

Metallization layers of an electrode and a solder film are formed exemplarily by: (1) coating a solder film on a copper foil on a printed circuit board with the plating method; and (2) forming metallization layers on a ceramic substrate and forming a thin solder film on the metallization layers by means of sputtering or vapor deposition. An electronic part formed with metallization layers of an electrode and a solder film is structured exemplarily such that a circuit element is formed on a semiconductor wafer and solder bumps are formed on electrode metallization layers of a connecting portion thereof. An electronic part, in which a plated layer consisting of Sn or a plated layer of a Sn alloy is formed on a lead surface of the electronic part, is an example, in which a solder film is formed on a lead surface of an electronic part.

A role which a solder film plays on a substrate or an electronic part will be described below.

In case of beforehand forming a solder film on a substrate, an electronic part is mounted so that a connecting portion of the electronic part abuts against the solder film, the semi-product is subjected to reflow to cause melting of the solder film provided on the substrate, and the solder wets and spreads over metallization layers provided at a connecting portion of the electronic part, etc., to achieve connection of the substrate and the electronic part.

In a sub-mount part, in which metallization layers is formed on a substrate containing ceramic, Si, etc. and a solder film is formed on the metallization layers by means of the thin film forming technique, an electronic part such as an optical element is pressed against the solder film, heating in a state without flux is effected to melt a thin film solder to cause the solder to wet and spread over the metallization layers of the electronic part for connection.

In a part, in which solder bumps are formed on an electrode metallization layers of an electronic part, solder bumps are in many cases formed by melting solder balls and causing the solder to wet and spread over the metallization layers of the electronic part when after being divided by dicing, solder bumps are to be formed before separating into chips. In this case, connection is achieved by mounting the electronic part on a printed circuit board, a ceramic substrate, etc. and make it being subjected to reflow, so as to melt the solder bumps and cause the solder to wet and spread over the metallization layers of the substrate. Also, in recent years, a circuit element is in some cases formed on a Si wafer and a method such as plating is used to form a solder film at the wafer level in a process prior to division by dicing.

For an electronic part including leads, solder paste is printed on a substrate, the leads of the electronic part are mounted on the paste, and the whole is subjected to reflow so as to melt the solder to connect the substrate and the leads of the electronic part to each other.

A plated film consisting of Ag or a plated film consisting of Sn is frequently used for lead frames of an electronic part. The plated film consisting of Ag is not oxidized at its surface and so excellent in wettability. While the plated film consisting of Sn is oxidized at its surface but a part of the oxidized film become broken somewhere and the solder on a side of a substrate and the Sn plated film melt to unite with each other so that connection is achieved.

Japanese Patent Laid-open No. Hei 5-190973 discloses a sub-mount for semiconductor laser, which is an example of the substrate for mounting electronic part. The sub-mount adopts Ti/Pt/Au as metallization layers and provides a Pt layer and an Au—Sn solder layer in a region, in which a semiconductor laser is to be mounted. Metallization layers are also formed on a back surface of the semiconductor laser and the semiconductor laser is fixed firmly by melting the Au—Sn solder on the sub-mount to connect it to the metallization layers.

The reason why an Au—Sn solder has been used in this technical field is that the Au—Sn solder is high in hardness and creep deformation is hard to occur. This is because when the semiconductor laser generates heat at the time of light emission to be raised in temperature to cause the solder to undergo creep deformation, the semiconductor laser is shifted in position and so optical coupling cannot be obtained.

In recent years, a semiconductor laser, etc. by a GaAs semiconductor has been frequently used as a light source for optical recording. Such semiconductor laser is affected by residual stress due to solder connection when the Au—Sn solder is used, resulting in decreased reliability in some cases. Such residual stress is generated since there is a difference in coefficient of thermal expansion between a semiconductor laser and a sub-mount when the semiconductor laser and the sub-mount are fixed at the fusing point of the solder and cooled to around room temperature. In the case where the solder is soft, the solder is deformed to relax the residual stress. However, in the case where the solder is hard, the effect of relaxing the residual stress is small.

Accordingly, if the Au—Sn solder is used to achieve connection of a semiconductor laser, of which an element is large in total length, a relatively large residual stress is generated in the semiconductor laser to shorten the life of the semiconductor laser in some cases.

In view of such a background, the use of a solder containing Sn, which is soft, as a main component for mounting of the semiconductor laser has come under consideration.

However, a solder film containing Sn as a main component and formed on a substrate, metallization layers of an electronic part, or a lead surface of an electronic part is, in many cases, formed at a surface thereof with an oxide film. This is because a solder ordinarily contains Sn as a main component and Sn is oxidized in the atmosphere.

With a view to surely achieving connection, it is convenient to use flux to reduce an oxide film present on a surface of the solder film to improve the connection property sharply. However, in recent years, it is often not permissible to use flux.

For example, failure in mounting an optical element is caused when flux residues are present in a light emitting portion of the optical element to intercept an optical path. Also, there may be damage to an optical element caused by flux itself or an organic solvent used for cleaning of flux residues.

In case of forming a solder film on a printed circuit board or a ceramic substrate, in case of forming solder bumps on a side of an electronic part, and in case of forming a solder film on a lead surface of an electronic part, respectively, flux has been hitherto used to decrease an adverse influence caused by the oxide film made on a surface of the solder film. In recent years, however, it has been increasingly promoted to make a connecting portion minute and to make a pitch small, and thus vaporization of a flux component and flow of flux at the time of connection may cause positional shift of a minute connecting portion to generate a short-circuit failure. Also, the material cost, coating process, and a subsequent cleaning process, respectively, of flux itself inherently constitute factors for an increase in cost, and so it is preferable to enable achieving connection simply in a fluxless manner.

It is estimated that a connecting portion is increasingly made minute for lead frames of electronic parts in the future, and solder paste printing on a substrate is approaching a limit in minuteness. That is, if connection can be achieved using solder plating on a side of an electronic part or the like without applying solder paste printing on a substrate, it is possible to sharply decrease failure in bridge between leads. Also, the use of flux possibly shifts a position of an electronic part, although slightly, due to generation of bubbles of flux at the time of heating or the like. Conventionally, since an amount of solder used was much, self-alignment caused by surface tension of molten solder prevented the positional shift of the electronic part, which is possibly caused by bubbles of flux. However, it can be expected that influences of such bubbles cannot be neglected when the amount of solder used is decreased as minuteness is promoted in the future. Also, since the use of flux is inherently a cause for an increase in cost in terms of material cost, flux coating process, and a subsequent cleaning process, a connection process, in which flux in as small in amount as possible is used, is desirable.

Also, a lead frame plated with Sn always involves a problem that a needle crystal called whisker grows to cause a short-circuit between leads. Making a lead pitch minute means that a short-circuit may be caused by even a shorter whisker, and thus, a further strict control will be demanded.

SUMMARY OF THE INVENTION

An object to be solved by the invention is to provide an electronic part (e.g. an electronic device), in which a solder film formed on a substrate or a connecting portion of the electronic part is prevented its surface from being oxidized and connection can be achieved in a fluxless manner.

The object can be attained by a substrate for mounting an electronic part (e.g. an electronic device), comprising a base material, metallization layers formed on the base material, and a Sn solder portion formed on a part of a surface of the metallization layers, in which an Ag film is formed on a surface of the Sn solder portion, the surface being used for mounting the electronic part.

Also, the object can be attained by an electronic part (e.g. an electronic device) comprising a base material, metallization layers formed on the base material, and a Sn solder portion formed on a part of a surface of the metallization layers, in which an Ag film is formed on a surface of the Sn solder portion.

Further, the object can be attained by an electronic part (e.g. an electronic device) comprising a lead frame, a function element mounted on the lead frame, a plurality of bonding wires, the bonding wire connecting a terminal portion of the function element and a connecting portion of the lead frame to each other, and a resin part that molds the function element, the plurality of bonding wires, and a part of the lead frame, in which leads extending outward from the resin part are subjected to Sn plating, and Ag films are formed on a connecting portion of the leads, which are subjected to Sn plating. The lead extending outward from the resin part is e.g. a portion of one of the lead frame which is exposed from the resin part and plated with tin (Sn). At least a portion of the tin-plated lead to which an external member to the electronic part (e.g. a substrate) is plated with silver (Ag).

While the metallization layers described above has a multilayer structure formed of a plurality of laminated layers each composed of a metal or an alloy, the metallization layers may be sometime replaced by a metallization layer formed of either a metal layer or an alloy layer. Both the metallization layers and the metallization layer are also defined as a metallization area formed in a surface of an insulating material (like a ceramic) or a semiconductor material to metalize an area in the surface. In other word, the metallization area is formed of at least one metallization layer.

BRIEF DESCRIPTION OF THE DRAWINGS

Preferred embodiments of the present invention will now be described in conjunction with the accompanying drawings, in which.

DESCRIPTION OF THE PREFERRED EMBODIMENTS

Embodiments for carrying out the invention will be described below with reference to the drawings.

Embodiment 1

Figure 1:
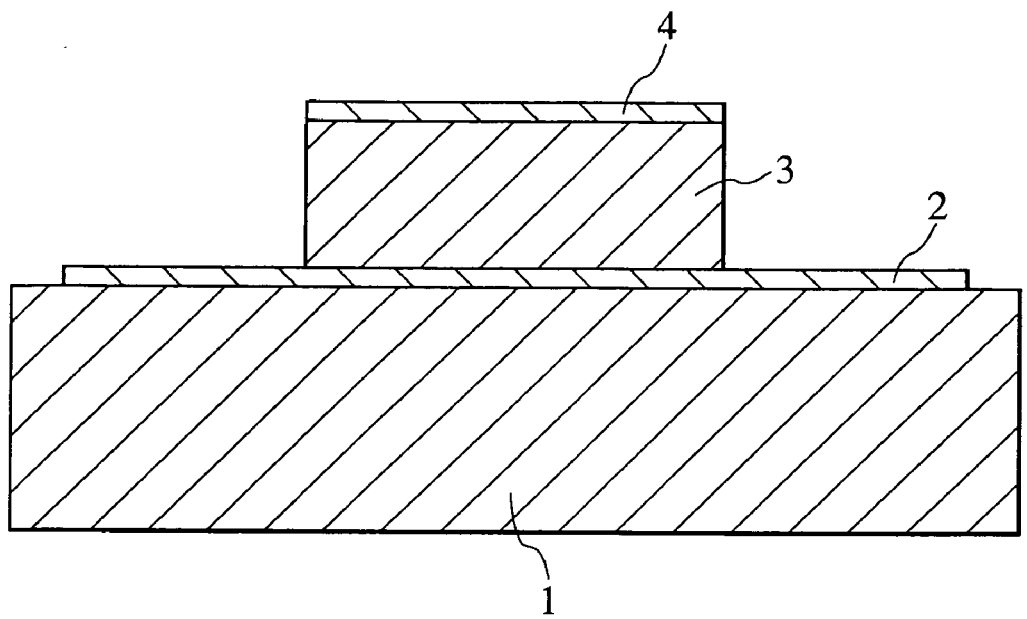
FIG. 1 is a cross sectional view showing a connecting portion of the substrate.

A substrate according to a first embodiment of the invention will be described below with reference to FIG. 1. FIG. 1 is a cross sectional view showing a connecting portion of the substrate.

The substrate 10 shown in FIG. 1 is provided by Electron Beam depositing metallization layers (in other words, the metallization area) 2, made of Ti/Pt/Au (deposition in the order of Ti→Pt→Au) at a time on a ceramic substrate 1, then forming a pattern by means of ion milling, subsequently forming a pattern with a resist, and vacuum evaporating a Sn (tin) solder film 3 and an Ag (silver) surface antioxidization film 4 at a time on the semi-product to carry out lift-off. The Ti (titanium) layer included in the metallization layers 2 severs for close contact with the ceramic substrate 1, the Pt (platinum) layer serves as a solder barrier layer, and the Au (gold) layer serves to ensure the wire bonding property. The metallization layers 2 have a thickness of 0.1 µm/0.2 µm/0.2 µm in order from the side of the ceramic substrate 1. Also, the Sn solder film 3 has a thickness of 3 µm, and the Ag film 4 has a thickness of 0.1 µm.

The Sn solder film 3 serves as a binding agent when the whole substrate is heated to connect electronic parts, etc. thereto. Since the Sn solder film 3 possesses the property of oxidation in the atmosphere, however, the Ag film 4 prevents oxidation of the Sn solder film 3. Portions, on which the Ag film 4 and the Sn solder film 3 are formed, define portions, on which electronic parts are to be mounted. Wire bonding is applied to the portion which the metallization layers 2 are exposed.

The effect of antioxidization of Sn produced by Ag will be described below in detail. Oxidation reaction of Ag is represented by the following formula (1).

$$4Ag+O_2 \rightarrow 2Ag_2O \qquad (1)$$

Temperature and oxygen partial pressure where the reaction formula proceeds rightward can be calculated from free energy of Gibbs of the reaction.

Free energy $\Delta G$ of Gibbs is represented as follows by the use of enthalpy $\Delta H$, entropy $\Delta S$, and absolute temperature T.

$$\Delta G = \Delta H - T\Delta S \qquad (2)$$

According to MATERIALS THERMOCHEMISTRY Sixth Edition (page 258) written by Kubacheswski, $\Delta H^0 = 31.1$ kJ/mol and $\Delta S^0 = 120.9$ J/K/mol in the standard state of 25° C. are deduced. Thus, a standard free energy of formation of $Ag_2O$ in the standard state of 25° C. becomes

Based on the calculation, a boundary of oxygen partial pressure for formation/decomposition of $Ag_2O$, that is, dissociation pressure is found.

$$\Delta G = \Delta G^0 + RT\ln K \qquad (3)$$

$$K = a_{(Ag2O)}/(a^2_{(Ag)} \times PO_2) \qquad (4)$$

wherein R indicates a gas constant, K indicates an equilibrium constant represented by the formula (3), a indicates each activity, and $PO_2$ indicates oxygen partial pressure. With the dissociation pressure of $Ag_2O$, $\Delta G = 0$ on the left side of the formula (3), and $a_{(Ag2O)} = 1$ and $a^2_{(Ag)} = 1$ in the formula (4) present $$\Delta G^0 = RT\ln PO_2 \qquad (5)$$

Accordingly, using $\Delta G^0$ found previously, the gas constant R=8.314 kJ/K/mol, and temperature 298 K. (25° C.), $PO_2$ is calculated as follows by modifying the formula (5).

$$PO_2 = \text{ext}(\Delta G^0/R/T) = 0.998 \text{ atm.} = 1011 \text{ hPa} \qquad (6)$$

Since oxygen concentration at 1 atm. is 21%, oxygen partial pressure presents 213 hPa (0.21 atm.), which is smaller than the dissociation pressure of $Ag_2O$. Accordingly, it can be concluded that Ag is not oxidized at 25° C. in the atmosphere. It is found from the above that since Ag is not oxidized at room temperature in the atmosphere, the forming of the Ag film 4 on the Sn solder film 3 as the structure shown in FIG. 1 has the effect of preventing oxidization of the Sn solder film.

According to the embodiment, it is possible to prevent formation of any oxide film over a substantially whole region in a wet process of the electronic part 10. This will be described below.

With the structure shown in FIG. 1, Sn and Ag being nobler than Sn contact with each other and Sn is exposed at side faces. In the case where corrosion proceeds due to water in the wet process, Sn being a base metal and exposed at side faces is one-sidedly ionized by a so-called cell reaction. In other words, with a cell, in which Ag and Sn make electrodes and water serves as an electrolyte, the Ag electrode is not subjected to corrosion as long as the Sn electrode being less noble remains. That is, the side faces are only partially subjected to corrosion (oxidization), and a surface of the Ag film 4, which occupies almost the whole of the connection surface, is not subjected to oxidization. Thus, in the case where electronic parts are to be connected by melting the Sn solder film 3, an oxide film that hinders connection is present only partially on the side faces and has little adverse influences. In case of taking account of both oxidization by ordinary oxygen and oxidization by water and the joint property by solder, that structure, in which an upper surface of the Sn solder film 3 is covered by the Ag film 4 as shown in FIG. 1 and the side faces of the Sn solder film 3 are exposed, is preferred from the above. If side faces of the Sn solder film are also covered by the Ag film, it can be anticipated that the anticorrosion effect of Ag by the cell reaction in the wet process is decreased, while the effect of antioxidization is obtained as compared with the case in which the upper surface of the Sn film is exposed, because Ag is hard to be susceptible to corrosion as compared with Sn.

When the Ag film is formed on the Sn solder film, there is a possibility that an $Ag_3Sn$ compound is formed at a Sn/Ag interface. However, the Ag film is preserved at a surface of the Ag film over a long term. This is because the speed of the diffusion of Ag into Sn is slow. Accordingly, the structure shown in FIG. 1 is preserved over a long term, so that the effect of antioxidization is also preserved over a long term.

An Ag film having a thickness of 0.1 µm was formed on a Sn solder film having a thickness of 3 µm, so as to confirm the melting property and the connection property. Consequently, it could be confirmed that the Ag film melted into a Sn solder simultaneously with melting of the Sn solder film and the Ag film did not have any adverse influence on the wettability and the connection property of the solder.

A film parameter of the Sn solder film and the Ag film is prescribed in terms of connection property. That is, an alloy of Sn and Ag has an Ag concentration of 73 wt % and the whole alloy makes $Ag_3Sn$. With less Ag, a liquid phase component surely remains at a Sn—Ag eutectic temperature of 221° C. or higher, so that connection is made possible. Accordingly, thicknesses of the Sn solder film 3 and the Ag film 4 should be determined so that the Ag concentration at the time of melting becomes equal to or less than 73 wt %.

For example, since silver eating utensils become blackish, it is generally thought that silver is liable to oxidize as compared with gold. Since Ag is not susceptible to surface oxidization by oxygen, it is thought that blackening of silver is attributable to oxidization due to moisture in the atmosphere. However, substrates and electronic parts are ordinarily manufactured in a clean room and kept in a desiccator, in which humidity is maintained very low. Accordingly, influences of moisture in the atmosphere are negligible.

As described above, it is possible according to the embodiment to provide a substrate, in which surface oxidization due to oxygen and oxidization due to moisture can be prevented over a major part of a connection surface and which has a solder film (here, referred to as solder film including Ag) having an excellent connection property. The structure according to the embodiment uses Ag for antioxidization and Ag is a most inexpensive metal free of oxidization in the atmosphere, so that an advantage in terms of cost is given.

In addition, while ceramic was used as a substrate in the embodiment described above, a glass substrate, a glass epoxy substrate, a semiconductor substrate, etc. can also be used. While Ti/Pt/Au was used as the metallization layers in the embodiment, it is not limitative but, for example, Cr/Cu/Au/, Ti/Ni/Au, etc. can also be used. While the metallization area is formed of the metallization layers 2 thus laminated on the substrate (i.e. a multilayer structure), the metallization area may possibly be replaced by a single metallization layer (e.g. of Ni (Nickel)-Cu (Copper) alloy or of Ti (Titanium)) in accordance with the material of the substrate 1. Also, while a Sn solder was used as a solder in the embodiment, it is not limitative but an alloy solder such as a Sn—Ag solder, a Sn—Ag—Cu solder, a Sn—Zn solder, a Sn—Pb solder, having Sn as a main component (the component having the largest amount) can also be used. A solder including a Sn solder and an alloy solder containing Sn as a main component is referred to as Sn solder. Ag is not limited to pure silver but includes an alloy containing Ag as a main component. A deposition method is not limited to vapor deposition but may adopt a thin film forming technique such as sputtering. In addition, the modifications described above are also common to other embodiments described below.

Embodiment 2

A further embodiment for the substrate according to the first embodiment of the invention will be described with reference to FIG. 2. Here, FIG. 2 is a cross sectional view showing a connecting portion of the substrate.

Figure 2:
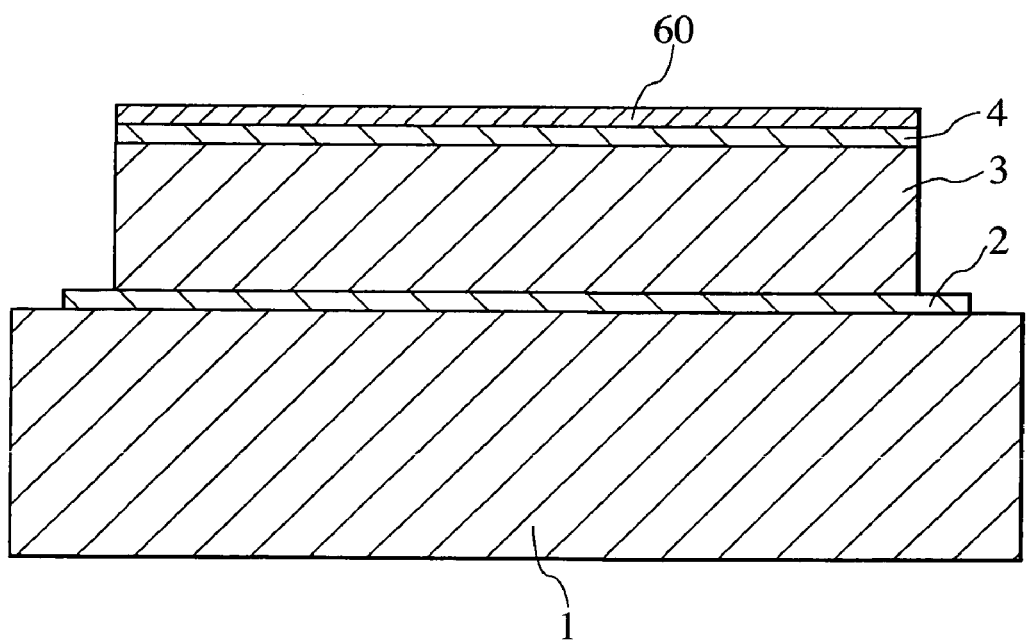
FIG. 2 is a cross sectional view showing the connection portion of the substrate according to an embodiment 2.

The substrate 20 shown in FIG. 2 is formed such that an Au film 60 is formed on the Ag film 4 of the substrate 10 described in the embodiment 1. The substrate is different from that in the embodiment 1 in that a Sn solder film 3, the Ag film 4 and an Au film 60 are contiguously formed on a lift-off resist having a pattern formed, by vacuum evaporation.

Since Au is a metal free of oxidization, it is frequently used for a surface coating film on metallization layers, wire bonding, or the like. Au is sometimes used as an antioxidization film in soldering. However, when an Au film is formed directly on a solder film containing Sn as a main component, Au diffuses into Sn and an antioxidization effect by Au is produced for a short period of time in some cases because mutual diffusion of Au and Sn is very rapid. With the structure shown in FIG. 2, however, the Ag film 4 functions as a barrier for mutual diffusion of Au and Sn to enable preventing diffusion of Au into Sn. Accordingly, surfaces of solder are not oxidized and an excellent wettability can be obtained.

In addition, the provision of an Au layer on an Ag layer is applicable to the following embodiments described below. In this case, when an Ag layer is formed by means of the thin film technique, an Au layer is continuously formed by means of thin film technique. When an Ag layer is formed by means of plating, an Au layer is continuously formed by means of plating.

Embodiment 3

A still further embodiment for the substrate according to the first embodiment of the invention will be described with reference to FIG. 3. Here, FIG. 3 is a cross sectional view showing a connection portion of the substrate.

Figure 3:
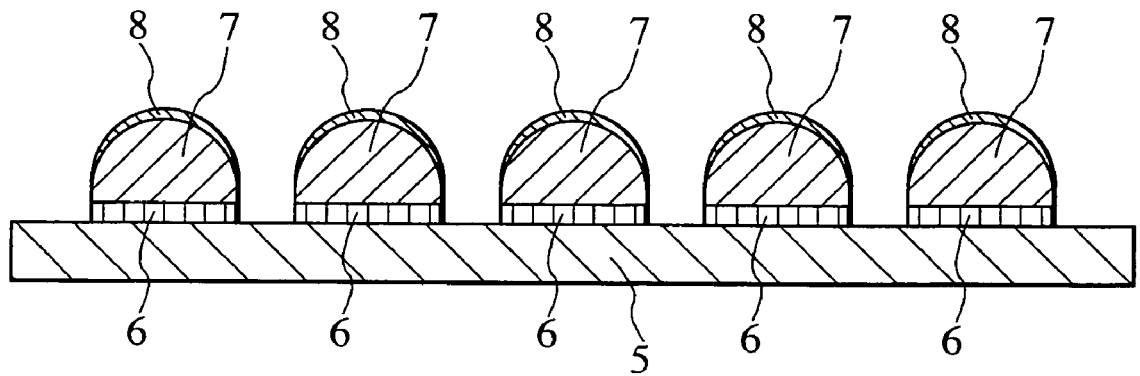
FIG. 3 is a cross sectional view showing the connection portion of the substrate according to an embodiment 3.

The substrate 30 shown in FIG. 3 is formed such that a flexible polyimide foil 5 and a copper foil are caused to bond to each other, Sn solder bumps 7 are formed on a Cu electrode metallization layers 6, which is formed by patterning the copper foil, by electroplating, and an Ag plated film 8 is formed on the Sn solder bumps 7. The composition of the solder bumps 7 may include an alloy solder described in the modification of the embodiment 1. In addition, a polyimide foil, which is disposed on an upper side in the figure and sandwiches the copper foil, is omitted for the sake of simplification of depiction.

When the Ag plated film 8 is formed to be thick, it covers the whole surfaces of the solder bumps 7, but minute non-plated regions are generated by adjusting a thickness of the film appropriately and forming the film to make the same a little thin. Since surfaces of the solder bumps 7 are slightly exposed in these regions, the effect of antioxidization of the Ag plated film 8 is produced by the cell reaction in the wet process. Also, likewise, since the Ag plated film is not oxidized at 25° C. in the atmosphere, any oxide film is not formed in Ag plated portions, so that any adverse influence is not made to the connection property.

If the flexible substrate 30 of such configuration is used, connection portions of electronic parts (not shown) being connected to the substrate 30 can be positioned in such a manner as to contact with the Ag plated film 8 on the solder bumps 7, and the substrate 30 and the electronic parts can be connected to each other in a fluxless manner by performing reflow. Advantages of fluxless connection include reduction in cost for flux itself, reduction in cost owing to reduction in the subsequent cleaning processes, a decrease in damage to parts by flux, etc.

Embodiment 4

An electronic part according to the second embodiment of the invention will be described with reference to FIG. 4. Here, FIG. 4 is a partial, cross sectional view showing a connection portion of the electronic part.

Figure 4:
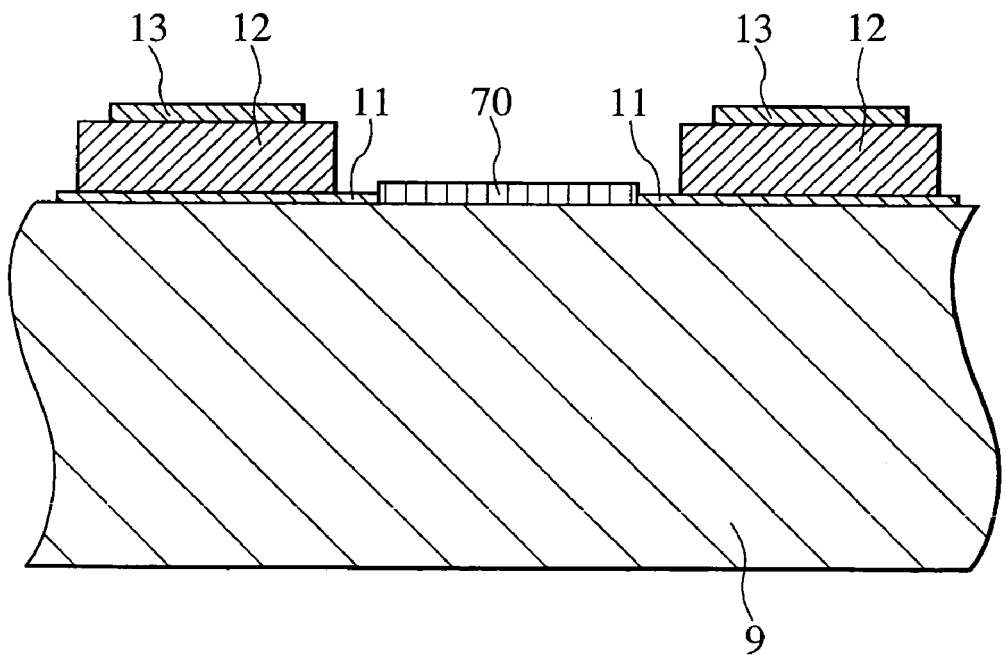
FIG. 4 is a partial, cross sectional view showing the connection portions of the electronic part.

The electronic part 40 shown in FIG. 4 is formed such that a circuit element 70 is formed on a Si wafer 9, then a plating resist (not shown) is applied on metallization layers 11 at the Si wafer level, solder bumps 12 are formed by plating, and after peeling-off of the plating resist, an Ag film 13 is formed by means of mask sputtering.

As in the case of the embodiment 1, the solder bumps 12 can be formed by carrying out metal/alloy plating of Sn, Sn—Ag, Sn—Ag—Cu, Sn—Zn, Sn—Pb, etc. Further, formation of the Ag film 13 makes it possible to prevent oxidation of surfaces of the Ag film 13 caused by oxygen and moisture in the atmosphere.

In addition, while after peeling-off of the plating resist, the Ag film 13 was formed by means of mask sputtering in the embodiment, Ag plating may be carried out consecutively after the solder bumps 12 are formed. In this case, Ag plating is somewhat different in shape from the Ag film 13.

In recent years, wafer-level mounting of electronic parts has been examined, and so a technique of forming solder bumps on an electronic part at the wafer level has become important. Since a wafer formed with solder bumps is then divided in a dicing process, the solder bumps are surely exposed to a cooling water in dicing. Accordingly, corrosion of solder bump surfaces caused by moisture causes an important problem. Corrosion of solder bump surfaces can be prevented by using the structure according to the embodiment.

Embodiment 5

A further embodiment of an electronic part according to the second embodiment of the invention will be described with reference to FIG. 5. Here, FIG. 5 is a cross sectional view showing the electronic part.

Figure 5:
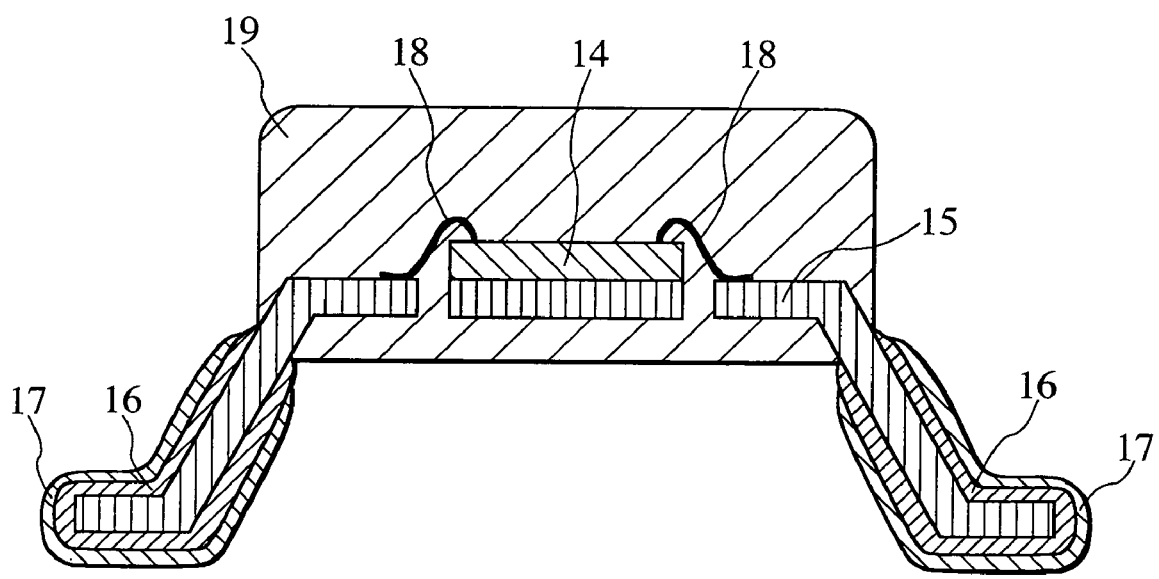
FIG. 5 is a cross sectional view showing the electronic part.

The electronic part 50 shown in FIG. 5 is formed such that a semiconductor chip 14 is mounted on a lead frame 15, the lead frame 15 and the semiconductor chip 14 are connected to each other by bonding wires 18, and the whole is molded by a resin 19. A solder plated film 16 and an Ag plated film 17 are formed on lead connection portions. According to the embodiment, the solder plated film 16 can be made by metal/alloy such as Sn, Sn—Ag, Sn—Ag—Cu, Sn—Zn and Sn—Pb. The effect of antioxidization of the solder plated film 16 produced by the Ag plated film 17 is the same as those in the embodiments described above.

In addition, while a substantially whole region of the solder plated film 16 is covered by the Ag plated film 17 in FIG. 5, it is necessary to carry out Ag plating only on a horizontal portion (a portion connected to a substrate) of leads of Small Outline Package so far as the connection property is concerned. The horizontal portion of the leads is depicted as an end of each portion of the lead frame 15 extended outside the resin (the resin mold) 19 in FIG. 5, and is extended horizontally. The substrate (not shown in FIG. 5) is exemplified as one of external members (external circuits) to the electronic part 50. Also, function elements built in an electronic part are not limited to semiconductor chips (as the semiconductor chip 14 shown in FIG. 5) but may be resistive elements, capacitor elements, etc.

The embodiment can provide an electronic part, in which a minute amount of solder plated on an electronic part enables mounting on a substrate without oxidization of a solder surface and without the use of flux.

Also, according to the embodiment, the substantially whole region of the solder plated film 16 is covered by the Ag plated film 17, so that there is produced an effect of enabling prevention of generation of Sn whisker.

According to the invention, it is possible to provide an electronic part, in which an antioxidization film for prevention of oxidization of a surface of solder is formed on a solder provided on a connecting portion of the electronic part and connection can be achieved in a fluxless manner.

We claim:

1. A substrate for mounting an electronic part, comprising:
a base material;
metallization layers formed on the base material;
a Sn solder portion formed on a part of a surface of said metallization layers;
an Ag film formed on a surface of the Sn solder portion wherein the Ag film is formed so that a ratio of Ag is 73 wt % or less based on a total amount of the Sn solder portion and the Ag film; and
an Au film formed on the Ag film,
the part of the surface of said metallization layers on which the Sn solder portion and Ag and Au films are formed being used for mounting the electronic part.

2. The substrate for mounting an electronic part as claimed in claim 1, wherein the Sn solder portion is composed of an alloy solder containing Sn as a main component.

3. The substrate for mounting an electronic part as claimed in claim 1, wherein the Ag film is composed of an alloy containing Ag as a main component.

* * * * *